(12) United States Patent
Wang et al.

(10) Patent No.: US 6,903,644 B2
(45) Date of Patent: Jun. 7, 2005

(54) INDUCTOR DEVICE HAVING IMPROVED QUALITY FACTOR

(75) Inventors: Sung-Hsiung Wang, Hsin-Chu (TW); Shuo-Mao Chen, Hsin-Chu (TW); Heng-Ming Hsu, Hsin-Chu (TW); Jui-Feng Kuan, Hsin-Chu (TW); Chih-Ping Chao, Hsin-Chu (TW); Chih-Hsien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 125 days.

(21) Appl. No.: 10/628,150

(22) Filed: Jul. 28, 2003

(65) Prior Publication Data

US 2005/0024176 A1 Feb. 3, 2005

(51) Int. Cl.⁷ .................................................. H01F 5/00
(52) U.S. Cl. ........................ 336/200; 336/232; 336/223
(58) Field of Search ................................. 336/200, 223, 336/232; 29/602.1

(56) References Cited

U.S. PATENT DOCUMENTS

| | | | | |
|---|---|---|---|---|
| 5,529,831 A | * | 6/1996 | Waga et al. | 428/209 |
| 5,565,837 A | * | 10/1996 | Godek et al. | 336/232 |
| 5,604,352 A | * | 2/1997 | Schuetz | 250/492.3 |
| 6,287,932 B2 | * | 9/2001 | Forbes et al. | 438/381 |
| 6,724,290 B1 | * | 4/2004 | Ohnmacht et al. | 336/200 |
| 6,798,039 B1 | * | 9/2004 | Gillespie et al. | 257/531 |
| 2002/0036561 A1 | * | 3/2002 | Jedlitschka | 336/232 |
| 2003/0231093 A1 | * | 12/2003 | Hsu et al. | 336/200 |

FOREIGN PATENT DOCUMENTS

| JP | 06036945 A | * | 2/1994 | H01F/27/28 |
|---|---|---|---|---|
| JP | 06140250 A | * | 5/1994 | H01F/15/00 |

* cited by examiner

*Primary Examiner*—Anh Mai
(74) *Attorney, Agent, or Firm*—Slater & Matsil, L.L.P.

(57) ABSTRACT

An inductor device including a first coil conductor (310) and a second coil conductor (510), the first coil conductor (310) being located over a substrate (120) and having a first pattern and a first conductivity, and the second coil conductor (510) being located on a substantial portion of the first coil conductor (310), having a second pattern substantially conforming to the first pattern, and having a second conductivity substantially greater than the first conductivity.

31 Claims, 5 Drawing Sheets

INDUCTOR DEVICE HAVING IMPROVED QUALITY FACTOR

TECHNICAL FIELD

The present invention is directed, in general, to inductor devices and, more specifically, to an inductor device having an improved quality factor, a method of manufacturing the device, and a system incorporating the device.

BACKGROUND

Advances in semiconductor device performance are largely attributable to reductions in device dimensions. Initially, the photolithographic and other micro-electronic fabrication techniques enabling such device scaling were not amenable to inductors, capacitors and other passive components often employed in semiconductor devices. Nevertheless, inductor design eventually evolved to take similar advantage of the advances in micro-electronic fabrication processes and experience scaling to a degree similar to that of active devices.

For example, inductors are now typically created on the surface of a semiconductor device substrate in a spiral shape created in a plane that is parallel to the substrate surface. The inductor may have several of these spiral-shaped coils as necessary to attain adequate inductance values. Unfortunately, conventional methods used to create the spiral-shaped inductors generally produce inductor devices having limited performance, as discussed below.

The performance parameter of an inductor is typically indicated as its quality factor Q. The quality factor is defined as the ratio between the energy stored in the reactive portion of the inductor and the energy that is lost in the reactive portion. Clearly, it is desired that the quality factor be maximized to the extent permitted within a particular application.

The Q value of an inductor can also be expressed by the equation $Q=W_0L/R$, where $W_0$ is the resonant frequency of oscillation of the inductor, L is the inductive value and R is the resistance of the inductor. This equation further indicates that, for a given resonant frequency $W_0$, the Q value of the inductor decreases as the resistance R increases.

However, current fabrication techniques or other factors limit the degree to which the resistance of existing inductor devices can be reduced. Consequently, inductor devices typically incorporated in conventional integrated circuits exhibit a quality factor limited to about 10.

Accordingly, what is needed in the art is an inductor device that addresses the problems discussed above.

SUMMARY OF THE INVENTION

To address the above-discussed deficiencies of the prior art, the present disclosure provides an inductor device that, in one embodiment, includes a first coil conductor having a first pattern and a second coil conductor located on a substantial portion of the first coil conductor and having a second pattern substantially conforming to the first pattern. The first coil conductor has a first conductivity and the second coil conductor has a second conductivity substantially greater than the first conductivity. The higher conductivity of the second coil conductor may decrease the series resistance of the inductor device. For example, the series resistance of the inductor device may be less than about 0.3 Ω. Consequently, the inductor device may have an increased quality factor, perhaps greater than about 20.

The present disclosure also provides a method of manufacturing an inductor device having an improved quality factor. In one embodiment, the method includes forming a first coil conductor having a first pattern and forming a second coil conductor on a substantial portion of the first coil conductor and having a second pattern substantially conforming to the first pattern. Again, the first coil conductor has a first conductivity and the second coil conductor has a second conductivity substantially greater than the first conductivity.

An integrated circuit device incorporating the inductor device having an increased quality factor is also introduced in the present disclosure. In one embodiment, the integrated circuit device includes an inductor device, an active device such as a complementary metal-oxide-semiconductor (CMOS) transistor, and interconnects coupling the inductor device and the active device. The inductor device includes coupled first and second coil conductors, wherein the second coil conductor has a higher conductivity than the first coil conductor, thereby reducing the series resistance of the inductor device and increasing the quality factor of the inductor device.

The foregoing has outlined preferred and alternative features of the present invention so that those skilled in the art may better understand the detailed description that follows. Additional features will be described hereinafter that form the subject of the claims of the invention. Those skilled in the art should appreciate that they can readily use the present disclosure as a basis for designing or modifying other structures for carrying out the same purposes and/or achieving the same advantages described in the present disclosure. Those skilled in the art should also realize that such equivalent constructions do not depart from the spirit and scope of the present disclosure.

BRIEF DESCRIPTION OF THE DRAWINGS

The principles of the present invention are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION OF ILLUSTRATIVE EMBODIMENTS

Figure 1A:
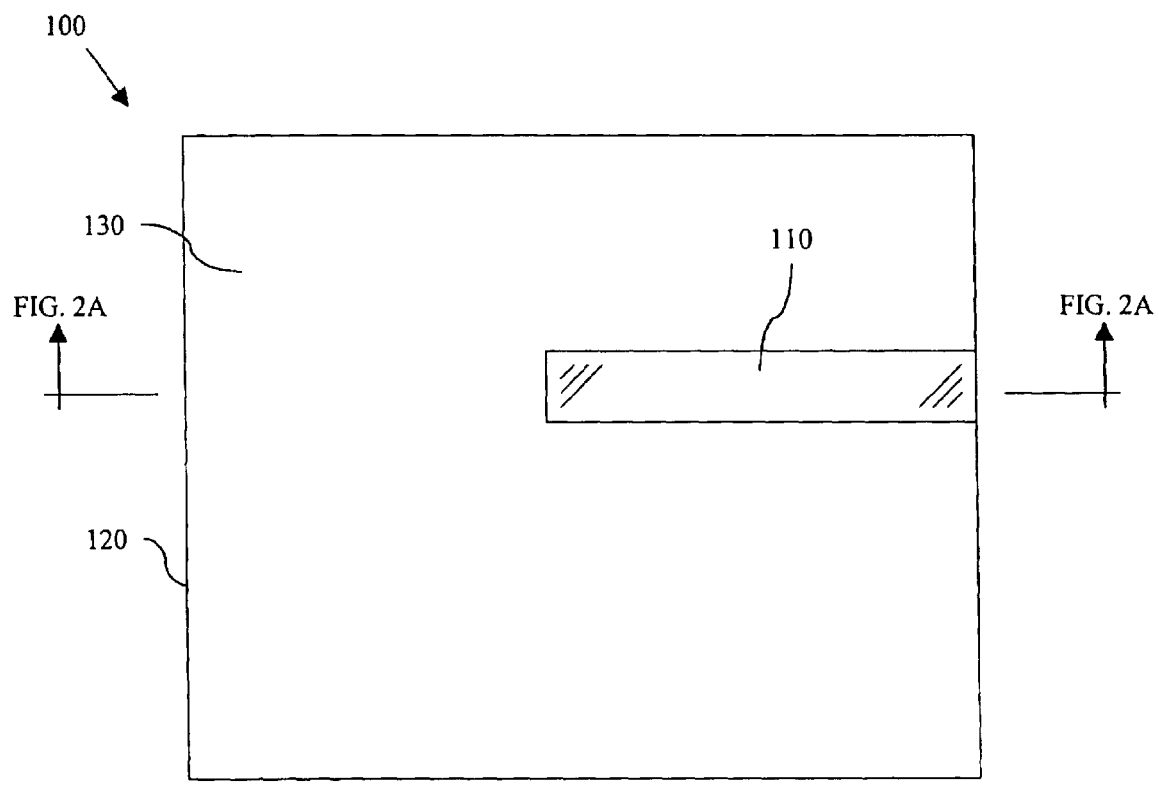
FIGS. 1A and 1B illustrate plan views of embodiments of an inductor device in an initial stage of manufacture according to aspects of the present disclosure.
Figure 2A:
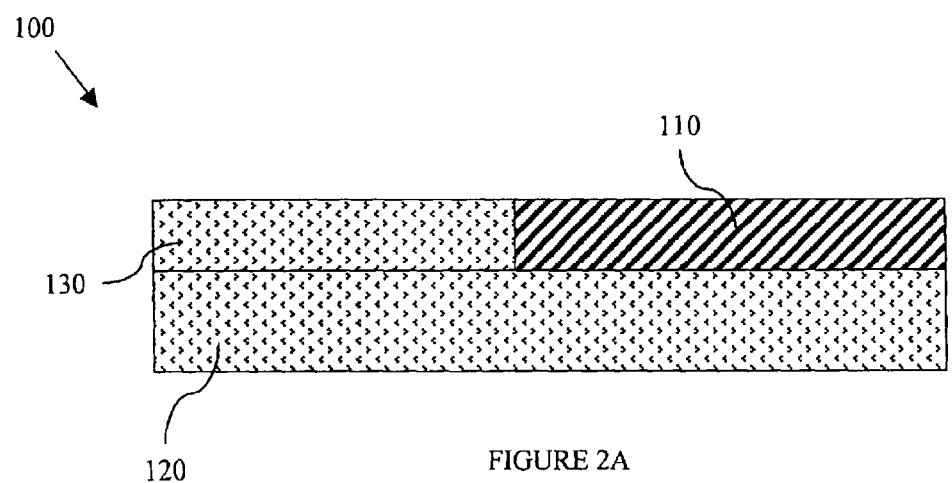
FIGS. 2A and 2B illustrate sectional views of the inductor devices shown in FIGS. 1A and 1B, respectively.

FIG. 1A illustrates a plan view of one embodiment of an inductor device 100 in an initial stage of manufacture according to aspects of the present disclosure. FIG. 2A illustrates a sectional view of the inductor device 100 shown in FIG. 1A. Referring initially to FIGS. 1A and 2A collectively, the manufacture of the inductor device 100 may begin with the formation of a first conductor 110 on a substrate 120. It is intended that forming the first conductor 110 on the substrate 120 also contemplates forming the first conductor 110 within the substrate 120.

Those skilled in the art will recognize that there are myriad ways in which the first conductor 110 may be formed. For example, the first conductor 110 may be formed by blanket deposition of a conductive material and subsequent patterning thereof. As another example, the first conductor 110 may be formed by patterning a layer of dielectric material 130 to form openings therein and subsequently filling the openings with a conductive material by chemical-vapor deposition or other deposition means. Accordingly, it is intended that the present disclosure does not limit the particular manner in which the first conductor 110 is formed on the substrate 120.

The thickness of the first conductor 110 may vary among applications. For example, in one embodiment the first conductor 110 may have a thickness of about 3,500 angstroms, whereas in another embodiment the first conductor 110 may have a thickness of about 9,000 angstroms, and in yet another embodiment the first conductor 110 may have a thickness of about 33,000 angstroms. However, any suitable or desired thickness of the first conductor 110 may be employed.

The first conductor 110 may comprise one of many existing or future-developed conductive compositions, including those typically employed for forming interconnects. For example, the first conductor 110 may comprise aluminum, copper, gold or alloys thereof. In one embodiment, the first conductor 110 may be an underpath conductor that serves as an input to the subsequently formed inductive element to interconnect the inductive element with other circuitry. However, in another embodiment the first conductor 110 may optionally be employed as a parallel coil in the inductor device 100, as further discussed below. As such, the first conductor 110 may generally comprise a non-magnetic metal or alloy, a magnetic metal or alloy, doped polysilicon or a polycide conductor material. Furthermore, first conductor 110, and the below-described first coil conductor 310 and second coil conductor 510 may alternatively be formed of multi-layer metals including one or more of the above-described materials. Although not illustrated, first conductor 110 may have formed thereon various additional coatings, such as an anti-reflective coating, a barrier layer, an adhesion layer, and the like, to improve the processing of the device. First coil conductor 310 and second coil conductor 510 may also include such additional coatings and layers, as dictated by the processing constraints.

Figure 1B:
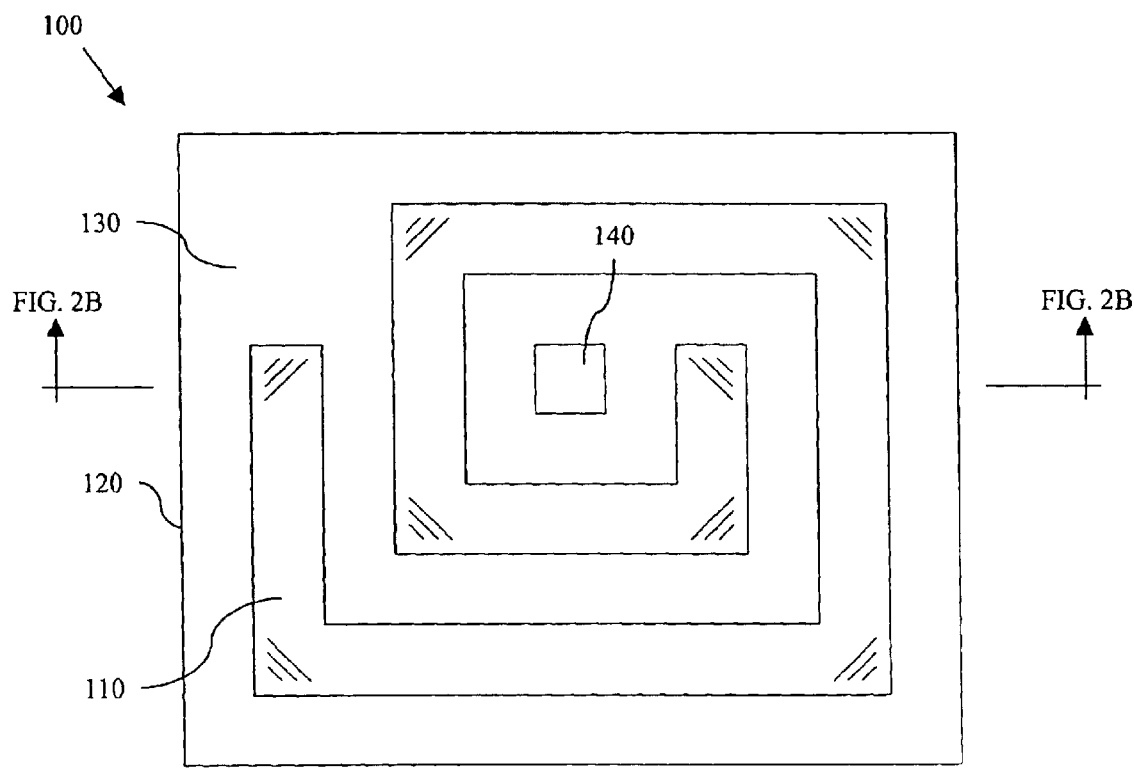
Figure 2B:
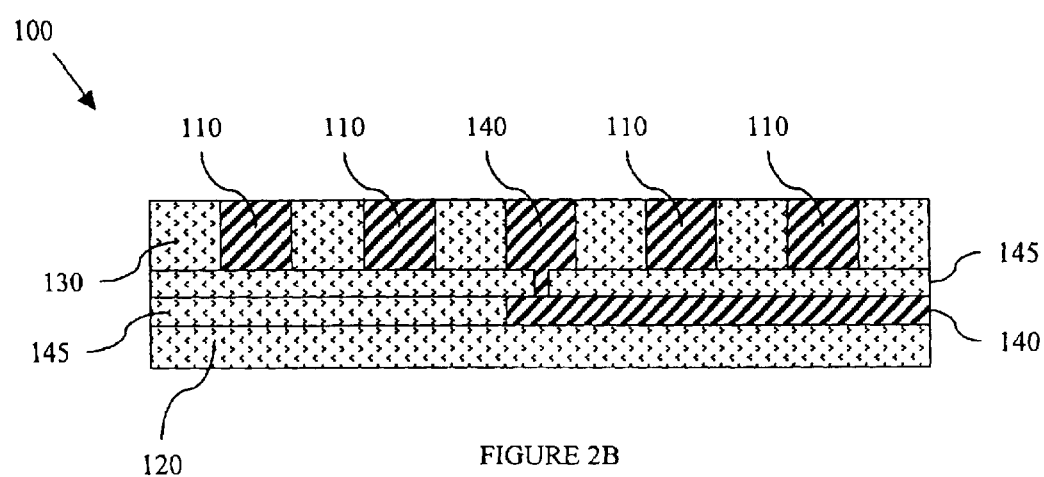

Referring to FIGS. 1B and 2B, illustrated are plan and sectional views of another embodiment of the inductor device 100 shown in FIGS. 1A and 2A, respectively. In the illustrated embodiment, the first conductor 110 may be employed as a parallel coil (parallel to subsequently formed coils), such that the first conductor 110 may include a portion of at least one winding of the inductor device 100. For example, in the particular embodiment shown in FIGS. 1B and 2B, the first conductor 110 has a pattern that includes ½ turns. However, the present disclosure is not limited to the layout shown in FIGS. 1B and 2B, such that the first conductor 10 may include any number of turns feasible with current and future developed micro-fabrication procedures. Those familiar with integrated inductor devices will also recognize that the first conductor 10 may be only one of many windings in the inductor device 100. For example, additional windings may be formed in other metallization layers, such as in the exemplary embodiments described below. Moreover, the use of the first conductor 110 as a parallel coil is optional, such that the first conductor 110 may have fewer or no turns, and may function only as an interconnect and/or an underpath, as shown in FIGS. 1A and 2A.

The pattern of the first conductor 110 may be spiral shaped. For example, as shown in FIG. 1B, the first conductor 110 may have a rectangular spiral pattern. Of course, the first conductor 10 may have a spiral pattern resembling any geometric shape. In general, in order to obtain advantageous features of the present invention, the first conductor 10 should form a substantially closed geometric pattern. By substantially closed geometric pattern, it is meant that at least a portion of the feature is substantially surrounded by at least one other portion of the feature. In the case illustrated in FIG. 1B, for instance, the inner ¾ turn of first conductor 10 is substantially surrounded by the outer ¾ turn of first conductor 110. Other examples of a substantially closed geometric pattern would include a true spiral pattern, a box-within-a-box pattern (square or rectangular), a hexagonal, octagonal or other polygon spiral pattern, an irregularly shaped spiral pattern, nested parallelogram or polygon patterns, and the like.

Especially in embodiments in which the first conductor 10 is employed as a parallel coil, the inductor device 100 may also include additional conductive members 140 employed as underpath inputs and/or interconnects. The conductive members 140 may be formed simultaneously with the first conductor 110. However, the conductive members 140 may also be formed prior to the formation of the first conductor 110, such as in another metal layer of an interconnect structure, as shown in FIG. 2B. For example, additional insulation layers 145 may be formed over the substrate 120 prior to forming the first conductor 110 and the conductive members 140 may be formed in one or more of the insulation layers 145. The conductive members 140 may include a landing pad for inter-level connection to subsequently formed conductive elements. Nonetheless, it is important to note that the underpath or other interconnection means of the inductor device 100, including the conductive members 140, may contribute to the series resistance of the inductor device 100. For example, the resistance of the underpath may range between about 0.01 Ω and about 0.2 Ω.

Figure 3:
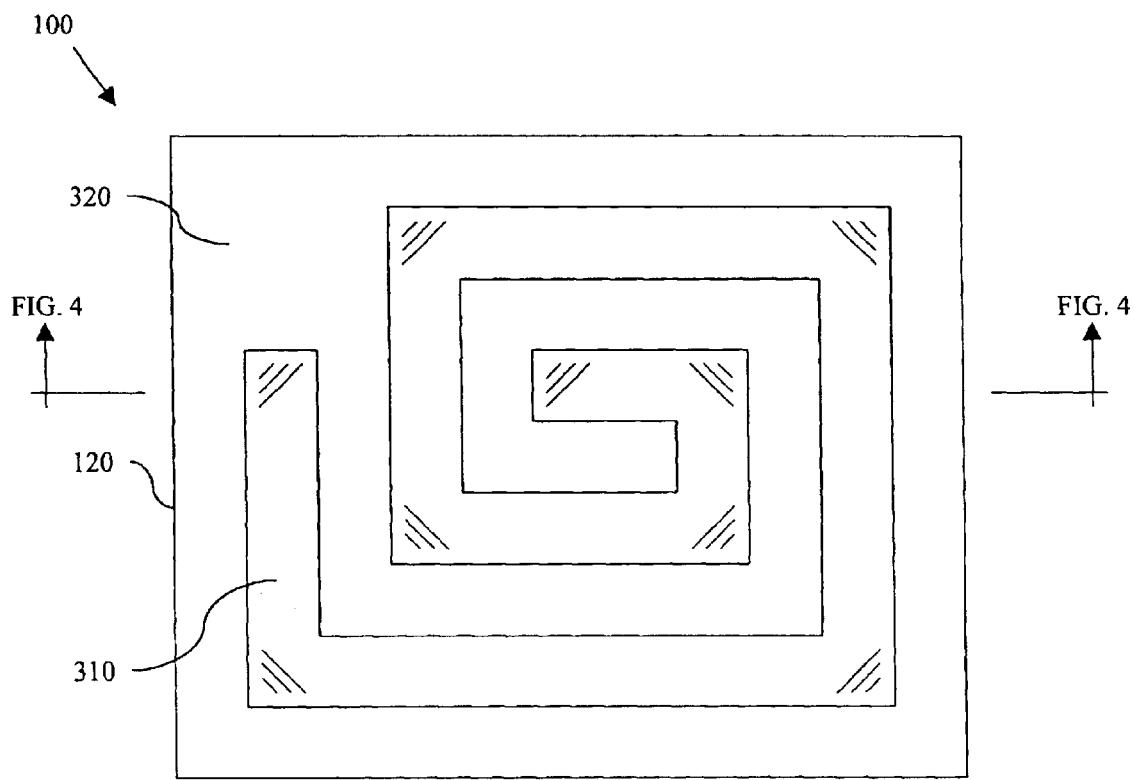
FIG. 3 illustrates a plan view of the inductor device shown in FIG. 1A in a subsequent stage of manufacture.
Figure 4:
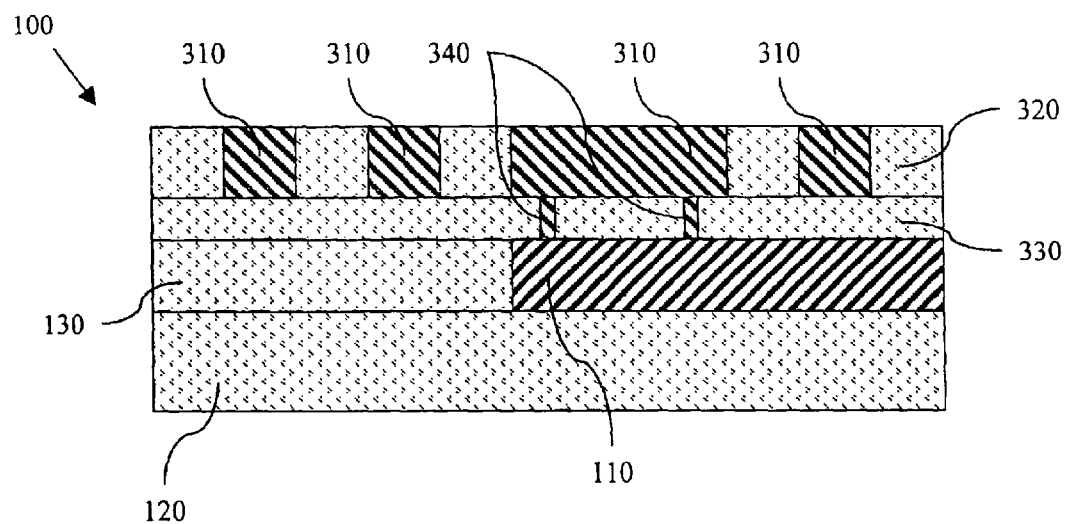
FIG. 4 illustrates a sectional view of the inductor device shown in FIG. 3.

Turning now to FIGS. 3 and 4, collectively, illustrated are views of the inductor device 100 shown in FIG. 1A in a subsequent stage of manufacture according to aspects of the present disclosure. FIG. 3 illustrates a plan view of the inductor device 100 shown in FIG. 1A, and FIG. 4 illustrates a sectional view of the inductor device 100 shown in FIG. 3. Of course, although not illustrated or discussed at length herein, aspects of the embodiments shown in FIGS. 3 and 4 may also be implemented with the embodiment shown in FIG. 1B.

As shown in FIGS. 3 and 4, the inductor device 100 also includes a first coil conductor 310 formed over the substrate 120 and first conductor 110. The first coil conductor 310 has a first conductivity determined by the composition selected therefor. For example, the first coil conductor 310 may comprise a non-magnetic metal or alloy, a magnetic metal or alloy, doped polysilicon or a polycide conductor material. However, any material suitable or desired for forming an inductive coil may be employed. The thickness of the first coil conductor 310 is not limited by the present disclosure. However, in one embodiment, the thickness of the first coil conductor 310 may be about 9,000 angstroms. In another embodiment, the thickness of the first coil conductor 310 may be about 33,000 angstroms.

As with the first conductor 110, there are many processes by which the first coil conductor 310 may be formed. For example, the first coil conductor 310 may be formed by blanket deposition of a conductive material and subsequent patterning thereof. Such patterning may be achieved by conventional etching processes. As another example, a dielectric layer 320 may be formed over the first conductor 110 and subsequently patterned to form openings in the desired shape of the first coil conductor 310, wherein the openings are subsequently filled with the material desired to form the first coil conductor 310. A portion of the dielectric layer 320, or an additional dielectric layer 330, may interpose the first coil conductor 310 and the first conductor 110. Whereas FIG. 4 illustrates two dielectric layers 320 and 330, one skilled in the art will recognize that the inter-level dielectric can comprise one or many dielectric layers. These layers can comprise, e.g., silicon oxide, silicon nitride, silicon oxynitride, low k dielectrics, and combinations thereof. In some instances, it is preferable that dielectric layer 320 have substantially different etch characteristics than dielectric layer 330, such as when a second coil conductor is formed using a dual damascene process.

The inductor device 100 may also include vias 340 directly or indirectly connecting the first coil conductor 310 and the first conductor 110. In one embodiment, the first coil conductor 310 and the vias 340 may be integrally formed, such as by a damascene process. In other embodiments, vias 340 are formed in dielectric layer 330 and filled with a conductive plug as is well known in the art. In some embodiments, it may be preferable to employ multiple vias 340 connecting corresponding regions of the first conductor 110 and the first coil conductor 310. Although FIG. 4 illustrates two parallel vias 340, one skilled in the art will recognize that two, three, or more parallel vias 340 can be employed in order to further lower the overall series resistance of the resulting inductive device. Employing more than one via 340 may be particularly advantageous when the first conductor 110 is employed as a parallel coil, as shown in FIGS. 1B and 2B.

The first coil conductor 310 generally serves as a portion of at least one winding of the inductor device 100. In the particular embodiment shown in FIGS. 3 and 4, the first coil conductor 310 has a pattern that includes 1¾ turns. However, the present disclosure is not limited to the layout shown in FIGS. 3 and 4, such that the first coil conductor 310 may include any number of turns achievable with current or future developed micro-fabrication procedures. The pattern of the first coil conductor 310 may substantially conform to the pattern of the first conductor 110 in embodiments in which the first conductor 110 is employed as a parallel coil, as shown in FIGS. 1B and 2B. As with first conductor 110, various alternative embodiment closed geometric patterns could be employed to form first coil conductor 310.

The pattern of the first coil conductor 310 may be spiral shaped. For example, as shown in FIG. 3, the first coil conductor 310 may have a rectangular spiral pattern. However, the first coil conductor 310 may have a spiral pattern resembling any geometric shape. Preferably, the first coil conductor 310 is formed in a closed geometric pattern, as described above.

The first coil conductor 310 substantially contributes to the total series resistance of the inductor device 100. In fact, the resistance of the first coil conductor 310 may account for more than 90% of the total resistance of the inductor device 100. For example, a conventional inductor device having an inductance value of about 1 nH may have a total series resistance of about 1.37 Ω, wherein the resistance of the inductive coil thereof may have a resistance of about 1.20 Ω. As discussed above, as the resistance of an inductor increases, the quality factor of the inductor decreases. Therefore, it is desirable to reduce the resistance of the first coil conductor 310 or the inductive coil formed thereby.

Figure 5:
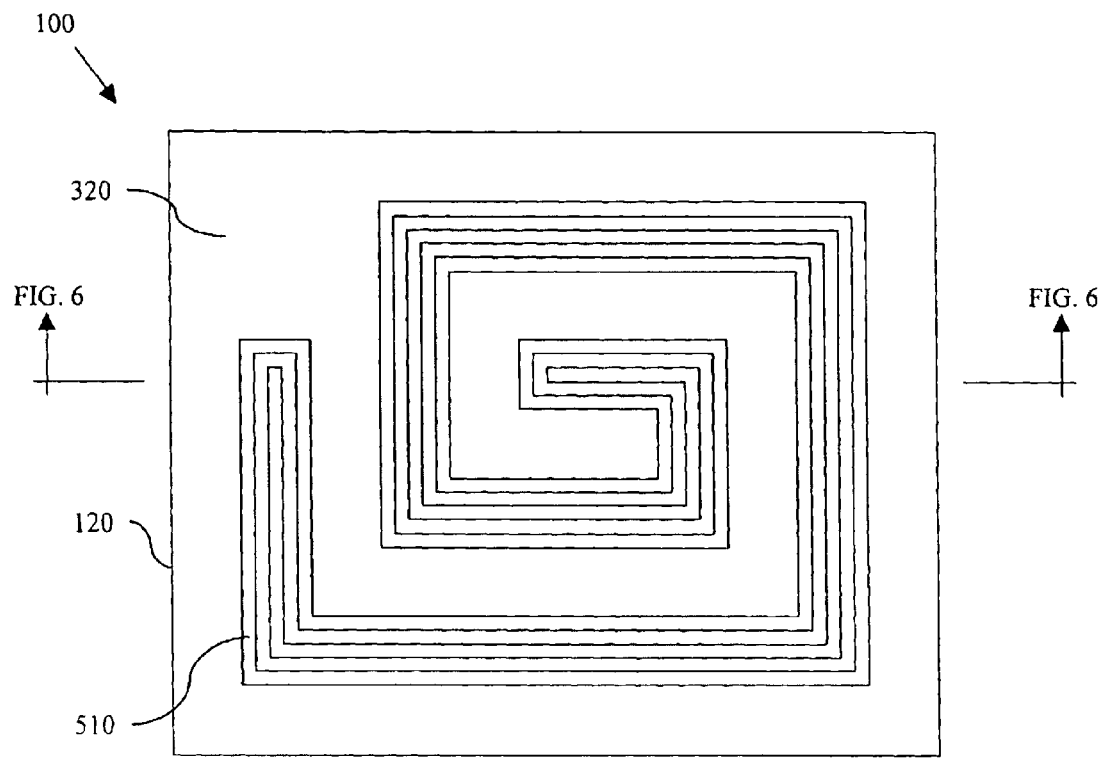
FIG. 5 illustrates a plan view of one embodiment of an inductor device constructed according to aspects of the present disclosure.
Figure 6:
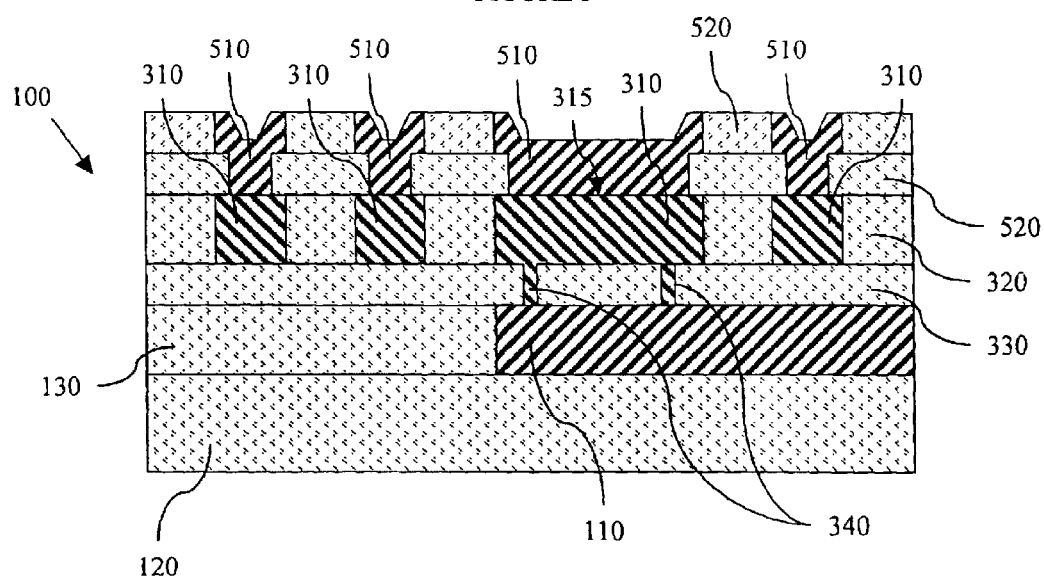
FIG. 6 illustrates a sectional view of the inductor device shown in FIG. 5.

Referring to FIGS. 5 and 6, collectively, illustrated are views of the inductor device 100 shown in FIG. 3 in a subsequent stage of manufacture according to aspects of the present disclosure. FIG. 5 illustrates a plan view of the inductor device 100 shown in FIG. 4, and FIG. 6 illustrates a sectional view of the inductor device 100 shown in FIG. 5. The embodiments shown in FIGS. 5 and 6 may illustrate the inductor device 100 in a substantially complete stage of manufacture.

As shown in FIGS. 5 and 6, the inductor device 100 also includes a second coil conductor 510 formed on the first coil conductor 310. The second coil conductor 510 contacts, whether directly or indirectly, a substantial portion of the first coil conductor 310. In one embodiment, the substantial contact between the first and second coil conductors 310, 510 may contemplate that at least about 80% of a contact surface 315 of the first coil conductor 310 is contacted by the second coil conductor 510. Of course, the second coil conductor 510 may contact the first coil conductor 310 to a greater or lesser degree within the scope of the present disclosure.

The second coil conductor 510 may comprise a material having a conductivity that is substantially greater than the conductivity of the first coil conductor 310, such as aluminum, copper or alloys thereof. For example, the conductivity of the second coil conductor 510 may be at least 20% greater than the conductivity of the first coil conductor 310. In a more specific embodiment, the second coil conductor 510 may comprise an aluminum-copper alloy. Using different materials for the first and second coil conductors 310, 510 is not the sole method for achieving greater conductivity. In some embodiments, the conductors 310, 510 may be formed of the same material, wherein the difference in conductivity may be achieved by the difference in the thickness of the layers used to form the respective coil conductors.

Moreover, the second coil conductor 510 has a pattern that substantially conforms to the pattern of the first coil conductor 310, such that the footprint and/or surface area of the second coil conductor 510 may be substantially similar to the footprint and/or surface area of the first coil conductor 310.

By forming the second coil conductor 510 on the first coil conductor 310, the higher conductivity of the second coil conductor 510 reduces the series resistance of the inductor coil collectively formed by the first and second coil conductors 310, 510. For example, incorporating the second coil conductor 510 in an otherwise conventional single-layer inductor having an inductance value of about 1.0 nH, such as one that may include the first coil conductor 310, may decrease the resistance of the resulting inductor coil from about 0.36 Ω to about 0.28 Ω, or by about 20%. As another example, incorporating the second coil conductor 510 in a dual-layer inductor device having an inductance value of about 1.0 nH, such as one incorporating both the first and second coil conductors 310, 510 as an inductor coil and the first conductor 110 as a parallel coil, may provide a total series resistance of the resulting inductor device that is reduced from greater than about 1.0 Ω to less than about 0.3 Ω, or by about 70%. As discussed above, a reduction in the series resistance of an inductor device increases the quality factor of the device, thereby rendering the device more efficient. Consequently, inductor devices constructed according to the principles of the present invention may exhibit a quality factor of greater than about 20.

There are numerous processes which may be employed to form the second coil conductor 510. For example, the second coil conductor 510 may be formed by blanket deposition of a conductive material and subsequent patterning thereof. Such patterning may be achieved by conventional etching processes. As another example, dielectric and/or passivation layers 520 may be deposited on the first coil conductor 310 and dielectric layer 320 and subsequently patterned to form openings in the shape of the desired pattern of the second coil conductor 510, such that the openings may thereafter be filled with conductive material. As another example, the second coil conductor 510 may be formed by a blanket deposition of conductive material that is subsequently patterned into a shape that substantially conforms to the pattern of the first coil conductor 310. The second coil conductor 510 may also be formed by a damascene process. In the case illustrated in FIG. 6, second coil conductor 510 is formed by a conformal deposition process, such as by a conformal deposition of an aluminum-copper alloy as is known in the art. The thickness of the second coil conductor 510 is not limited by the present disclosure. In one embodiment, the thickness of the second coil conductor 510 may be about 12,000 angstroms. It has been found that a particularly advantageous thickness of the second coil conductor 510 may be that which provides resistance (or conductivity) equivalent to a copper layer having a thickness of about 8,400 angstroms.

In the preferred embodiment, and as illustrated in FIGS. 5 and 6, first coil conductor 310 is preferably formed in top level metal and dielectric layer 520 is preferably a passivation layer, such as silicon nitride. Other passivation layers are within the scope of the invention, however. The second coil conductor 510 is preferably formed above the passivation layer using, e.g., post-passivation interconnect processing as is known in the art. In some embodiments, second coil conductor 510 may be formed simultaneously with bond pads that are used to interconnect the integrated circuit device in which conductor 100 is formed with other components. In another embodiment, first coil conductor 310 is formed simultaneously with bond pads and second conductor coil 510 is formed simultaneously with a metallization process that is formed atop the bond pads, such as an aluminum layer formed over a copper bond pad. In still other embodiments, the second coil conductor 510 may be formed in a metal layer that is formed prior to the passivation layer.

The following table illustrates the effect of different materials for the first conductor 110, first coil conductor 310, and second coil conductor 510 for various preferred embodiment inductor devices 100. Note that favorable total resistance values R (which, as described above, impact the quality factor Q) can be achieved with various combinations of metal layers. A very favorable resistance of 0.25813 ohms can be achieved with a 9,000 angstrom thick copper first conductor 110 employed as a parallel coil, a 30,000 angstrom thick copper first coil conductor 310, and a 12,000 angstrom thick aluminum-copper alloy second coil conductor 510, using standard semiconductor manufacturing processes. This meets the desired total series resistance goal of less than 0.3 ohm in order to reach a quality factor of approximately 20. As shown in the table, even lower resistance can be achieved through the use of dual 30,000 angstrom copper layers. Of course, the present disclosure is not limited to the exemplary embodiments provided in the following table. In the table, M0 may represent the first conductor 110, M1 may represent the first coil conductor 310 and M2 may represent the second coil conductor 510, assuming a line width of about 15 μm.

| Inductor Structures | | Under Path-M0 | R top | R bot | Total R | Process Availability |
|---|---|---|---|---|---|---|
| Single layer inductor | M1 + M2 | | | | | |
| Single 9K inductor | | 9K | 3.5K | 1.192 | 0.180 | 1.372 Standard |
| Single 30K inductor | | 30K | 3.5K | 0.358 | 0.180 | 0.538 Standard |
| AlCu pad + 30K inductor | | 38.4K | 3.5K | 0.279 | 0.180 | 0.459 Standard |
| Single 9K inductor | | 9K | 9K | 1.192 | 0.056 | 1.247 Standard |
| Single 30K inductor | | 30K | 9K | 0.358 | 0.056 | 0.413 Standard |
| AlCu pad + 30K inductor | | 38.4K | 9K | 0.279 | 0.056 | 0.335 Standard |
| Dual layer inductor | M0 + M1 + M2 | | | | | |
| 9L//3.5K | | 12.5K | 3.5K | 0.858 | 0.180 | 1.038 Standard |
| 30K//3.5K | | 33.5K | 3.5K | 0.320 | 0.180 | 0.500 Standard |
| AlCu pad//30K//3.5K | | 41.9K | 3.5K | 0.250 | 0.180 | 0.430 Standard |
| 9K//9K | | 18K | 9K | 0.534 | 0.056 | 0.589 Standard |
| 30K//9K | | 39K | 9K | 0.246 | 0.056 | 0.302 Standard |
| AlCupad/30K//9K | | 47.4K | 9K | 0.203 | 0.056 | 0.258 Standard |
| 30K//30K | | 60K | 30K | 0.160 | 0.016 | 0.176 Dual 30K Phase in |
| AlCupad//30K//30K | | 68.4K | 30K | 0.140 | 0.016 | 0.157 Dual 30K Phase in |

Figure 7:
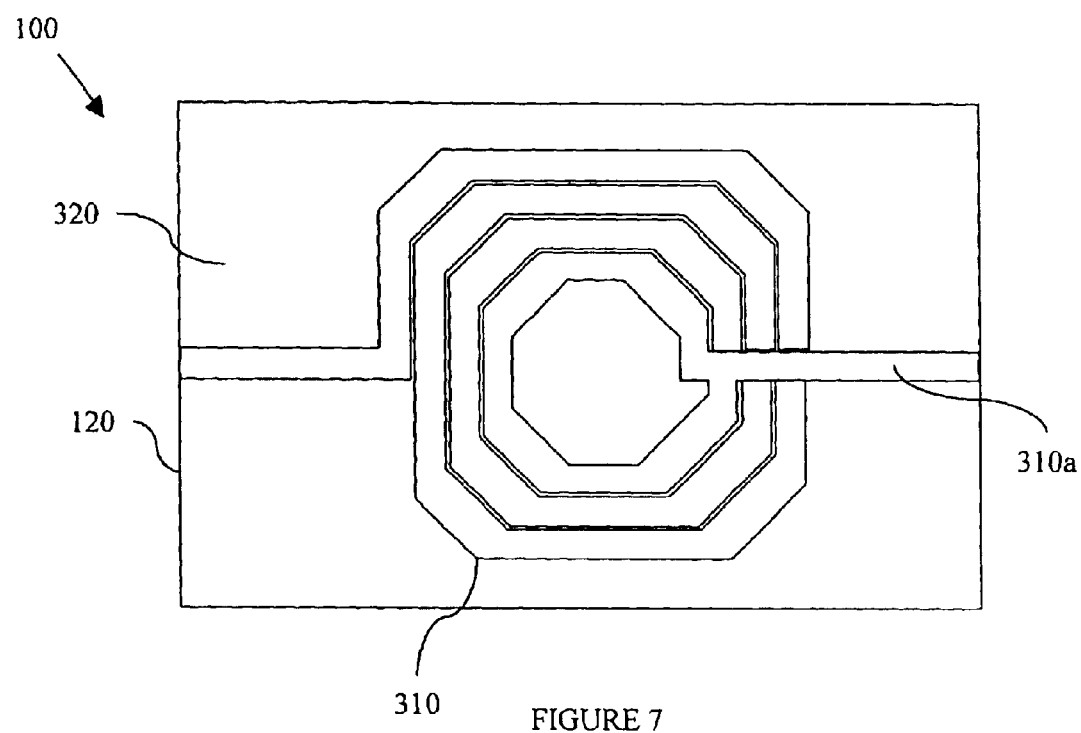
FIG. 7 illustrates a plan view of another embodiment of an inductor device in an intermediate stage of manufacture according to aspects of the present disclosure.

Referring to FIG. 7, illustrated is a plan view of another embodiment of the inductor device 100 shown in FIG. 6 in an intermediate stage of manufacture according to aspects of the present disclosure. In one embodiment, the stage of manufacture represented in FIG. 7 may be substantially the same stage as shown in FIG. 3. However, in the embodiment shown in FIG. 7, the pattern of the first coil conductor 310 may have an octagonal spiral shape. The first coil conductor 310 may include an input or output member 310a that may interrupt portions of the spiral shape, such that portions of an underlying metal layer (such as the first conductor 110 shown in FIGS. 1A, 1B, 2A and 2B) may be coupled to the first coil conductor 310 (such as by vias 340 shown in FIG. 4) to form a continuous spiral coil having several nested turns. Previously formed parallel coils or subsequently formed coil conductors (e.g., second coil conductor 510) may have substantially similar shapes to that of the first coil conductor 310. The embodiment shown in FIG. 7 is provided herein to demonstrate that the shape of the coil conductors may vary among applications.

Figure 8:
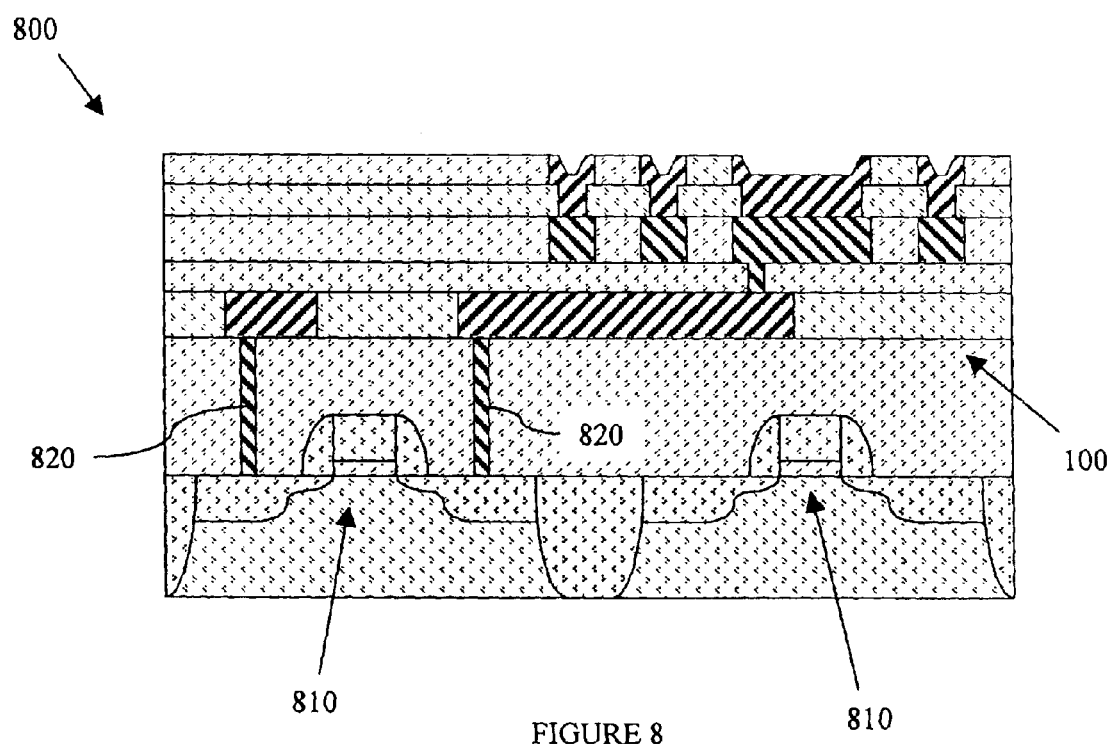
FIG. 8 illustrates a sectional view of an embodiment of an integrated circuit device constructed according to aspects of the present disclosure.

Referring to FIG. 8, illustrated is a sectional view of one embodiment of an integrated circuit device 800 constructed according to aspects of the present disclosure. The integrated circuit device 800 may be one environment in which the inductor device 100 shown in FIGS. 5 and 6 may be implemented. Accordingly, reference numbers for features shown in FIGS. 5, 6 and 8 have been maintained where possible.

In addition to the inductor device 100, the integrated circuit device 800 may include active devices 810 located in or on the substrate 120 and interconnects 820 directly or indirectly coupling one of the active devices 810 and the inductor device 100. Although the particular embodiment shown in FIG. 8 illustrates the active devices 810 as complementary metal-oxide-semiconductor (CMOS) devices, other active and/or passive devices may be included in the integrated circuit device 800 and/or coupled directly or indirectly to the inductor device 100. The inductor device 100 may be particularly advantageous in high frequency applications of the integrated circuit device 800, such as for circuits operating in the range of 900 MHz, such as is currently employed in radio and cellular communications such as the GSM carrier standard.

Moreover, implementation of the inductor device 100 into existing fabrication processes may be simple and cost effective. For example, fabrication of the inductor device 100 may be achieved by employing existing fabrication techniques (although future-developed techniques may also be employed). In addition, one or more of the first conductor 10, the first coil conductor 310 and the second coil conductor 510 may be formed simultaneously with existing metallization layers, such that incorporation of the inductor device 100 into existing designs may not require additional process steps.

Although the embodiments of the present disclosure have been described in detail, those skilled in the art should understand that they can make various changes, substitutions and alterations herein without departing from the spirit and scope of the disclosure.

What is claimed is:

1. An inductor device, comprising:
   a first coil conductor located over a substrate and having a first conductivity and a first pattern; and
   a second coil conductor located on a substantial portion of said first coil conductor, having a second conductivity substantially greater than said first conductivity, and having a second pattern substantially conforming to said first pattern.

2. The inductor device as recited in claim 1 wherein said first coil conductor comprises one selected from the group consisting of:
   a non-magnetic metal;
   a non-magnetic metal alloy;
   a magnetic metal;
   a magnetic metal alloy;
   doped polysilicon; and
   a polycide conductor material.

3. The inductor device as recited in claim 1 wherein said second coil conductor comprises aluminum.

4. The inductor device as recited in claim 1 wherein said second coil conductor comprises an aluminum alloy.

5. The inductor device as recited in claim 1 further comprising a patterned passivation layer located over said first coil conductor and having at least one opening exposing at least a portion of said first coil conductor, wherein said second coil conductor contacts said first coil conductor in said at least one opening.

6. The inductor device as recited in claim 1 further comprising:
   a parallel coil separated from said first coil conductor by an insulator layer and having a third pattern substantially conforming to said first pattern; and
   a via extending through said insulator layer and connecting said first coil conductor and said parallel coil.

7. The inductor device as recited in claim 1 wherein said first pattern is a spiral pattern having a shape selected from the group consisting of:
   a square;
   a rectangle; and
   an octagon.

8. The inductor device as recited in claim 1 wherein said second coil conductor has a thickness of about 12,000 angstroms.

9. The inductor device as recited in claim 1 wherein said inductor device has a series resistance that is less than about 0.3 $\Omega$.

10. The inductor device as recited in claim 1 wherein said inductor device has a quality factor of at least about 20.

11. A method of manufacturing an inductor device, comprising:
    forming a first coil conductor over a substrate, said first coil conductor having a first conductivity and a first pattern; and
    forming a second coil conductor on a substantial portion of said first coil conductor, said second coil conductor having a second conductivity substantially greater than said first conductivity and having a second pattern substantially conforming to said first pattern.

12. The method as recited in claim 11 wherein said first coil conductor comprises one selected from the group consisting of:
    a non-magnetic metal;
    a non-magnetic metal alloy;
    a magnetic metal;
    a magnetic metal alloy;
    doped polysilicon; and
    a polycide conductor material.

13. The method as recited in claim 11 wherein said second coil conductor comprises aluminum.

14. The method as recited in claim 11 wherein said second coil conductor comprises an aluminum alloy.

15. The method as recited in claim 11 further comprising forming a patterned passivation layer over said first coil conductor, said patterned passivation layer having at least one opening exposing at least a portion of said first coil conductor, wherein said second coil conductor contacts said first coil conductor in said at least one opening.

16. The method as recited in claim 11 further comprising:
   forming a parallel coil having a third pattern substantially conforming to said first pattern;
   forming an insulator layer over said parallel coil, wherein said insulator layer interposes said first coil conductor and said parallel coil; and
   forming a via extending through said insulator layer and connecting said first coil conductor and said parallel coil.

17. The method as recited in claim 11 wherein said first pattern is a spiral pattern having a shape selected from the group consisting of:
   a square;
   a rectangle; and
   an octagon.

18. The method as recited in claim 11 wherein said second coil conductor has a thickness of about 12,000 angstroms.

19. The method as recited in claim 11 wherein said second coil conductor has a thickness selected to provide a resistance equivalent to about 8,400 angstroms thick copper.

20. The method as recited in claim 11 wherein said forming said second coil conductor includes depositing and etching a metal layer.

21. An integrated circuit device, comprising:
   a substrate;
   an inductor device, including
      a first coil conductor located over said substrate and having a first conductivity and a first pattern, and
      a second coil conductor located on a substantial portion of said first coil conductor, having a second conductivity substantially greater than said first conductivity, and having a second pattern substantially conforming to said first pattern;
   an active device located in said substrate; and
   interconnects coupling said active device and said inductor device.

22. The integrated circuit device as recited in claim 21 wherein said first coil conductor comprises one selected from the group consisting of:
   a non-magnetic metal;
   a non-magnetic metal alloy;
   a magnetic metal;
   a magnetic metal alloy;
   doped polysilicon; and
   a polycide conductor material.

23. The integrated circuit device as recited in claim 21 wherein said second coil conductor comprises aluminum.

24. The integrated circuit device as recited in claim 21 wherein said second coil conductor comprises an aluminum alloy.

25. The integrated circuit device as recited in claim 21 wherein said inductor device further includes a patterned passivation layer located over said first coil conductor and having at least one opening exposing at least a portion of said first coil conductor, wherein said second coil conductor contacts said first coil conductor in said at least one opening.

26. The integrated circuit device as recited in claim 21 wherein said inductor device further includes:
   a parallel coil separated from said first coil conductor by an insulator layer and having a third pattern substantially conforming to said first pattern; and
   a via extending through said insulator layer and connecting said first coil conductor and said parallel coil.

27. The integrated circuit device as recited in claim 21 wherein said first pattern is a spiral pattern having a shape selected from the group consisting of:
   a square;
   a rectangle; and
   an octagon.

28. The integrated circuit device as recited in claim 21 wherein said second coil conductor has a thickness of about 12,000 angstroms.

29. The integrated circuit device as recited in claim 21 wherein said inductor device has a series resistance that is less than about 0.3 $\Omega$.

30. The integrated circuit device as recited in claim 21 wherein said inductor device has a quality factor of at least about 20.

31. An inductor device comprising:
   a substrate;
   a first metal layer comprising
      a first conductor formed in a closed pattern on said substrate, and
      a first metal interconnect feature on said substrate;
   a first dielectric formed atop said first conductor;
   a first coil conductor formed on said first dielectric layer in a closed pattern substantially overlying said first conductor and being in electrical contact with said first conductor;
   a passivation layer formed atop said first coil conductor; and
   a second coil conductor formed on said passivation layer in a closed pattern substantially overlying said first coil conductor and being in electrical contact with said first coil conductor.

* * * * *